United States Patent [19]

Hu

[11] 4,394,632
[45] Jul. 19, 1983

[54] MILLIMETER-WAVE ODD HARMONIC FREQUENCY MULTIPLIER

[75] Inventor: Chi P. Hu, Santa Barbara, Calif.
[73] Assignee: Honeywell Inc., Minneapolis, Minn.
[21] Appl. No.: 278,815
[22] Filed: Jun. 29, 1981
[51] Int. Cl.³ .............................................. H01P 1/20
[52] U.S. Cl. .................................... 333/218; 333/250
[58] Field of Search ................ 333/218, 250; 363/157, 363/158, 159

[56] References Cited

U.S. PATENT DOCUMENTS

| 3,334,295 | 8/1967 | Polin et al. | 333/218 |
| 3,381,207 | 4/1968 | Guthrie | 333/218 |
| 3,400,322 | 9/1968 | Habra | 333/218 |
| 4,228,411 | 10/1980 | Harrison | 333/218 |

OTHER PUBLICATIONS

Takada et al., *Frequency Triplers and Quadruplers With GaAs Schottky-Barrier Diodes at 450 and 600 Ghz*, IEEE Trans. MTT, May 1979, pp. 519–523.

*Primary Examiner*—Paul L. Gensler
*Attorney, Agent, or Firm*—Roger W. Jensen

[57] ABSTRACT

A millimeter-wave odd-harmonic frequency multiplier comprising a block member having an RF output port and an RF input port at right angles to one another with a pair of nonlinear resistance type diodes positioned at the intersection of the RF input port and the RF output port.

12 Claims, 12 Drawing Figures

4,394,632

MILLIMETER-WAVE ODD HARMONIC FREQUENCY MULTIPLIER

BACKGROUND OF THE INVENTION

This invention is applicable to the field of very high frequency/very short wave-length radio frequency apparatus. As frequencies have increased it has become more and more difficult to develop, at any cost, RF oscillators or RF oscillating means for generating the very high desired frequencies. One solution is to use a lower frequency RF source and then use multiplying means for multiplying the frequency of the basic source and certain prior art frequency multipliers exist, although each of them has various shortcomings, problems, or other limitations. While even harmonic multipliers are known, there have been no prior art efficient odd harmonic multipliers, i.e., multipliers without significant energy dissipation losses. It will be understood that a frequency tripler is significantly advantageous over a frequency doubler, i.e., a fifty percent increase in output frequency with approximately equal energy transmission efficiency.

SUMMARY OF THE INVENTION

My invention is a frequency multiplier which is characterized by multiplying the odd-harmonics of the basic applied RF signal and, in the preferred embodiment, functions as a frequency tripler. In my invention nonlinear resistance diodes are arranged in antiparallel fashion for the purpose of terminating the undesired harmonic frequencies without incurring extra circuit losses.

I am aware of prior art schemes, such as U.S. Pat. Nos. 3,076,133; 3,311,811; and 3,582,760. These prior art arrangements have certain disadvantages not found in my invention. For example, they rely on reactance schemes such as nonlinear capacitance diodes and further require tank circuit stages for each diode so as to generate off-harmonics.

In brief therefore, my invention comprises a block member of metallic material which has main and top surfaces at an angle to one another and with a wave-guide RF output port extending from the main surface part way through said member. The port has a rectangular cross-section of constant width and with the portion adjacent to the main surface having a height selected in accordance with the desired frequency output of the multiplier and with the remainder of the port having a height which is substantially reduced in size. Further, the apparatus includes an RF input port extending from the top surface through the block member to connect with the remainder of the wave guide port. Low pass filter means are insulatively positioned in the input port and a pair of antiparallel diodes are positioned at the junction of the remainder of the wave-guide output port and the RF input port. The apparatus functions upon a millimeter-wave signal of a base frequency being applied to the RF input port to produce an output signal at the RF output port of an odd-harmonic of said base frequency, the predominant signal in the output being the third harmonic of the base frequency.

DESCRIPTION OF THE PREFERRED EMBODIMENT

Figure 1:
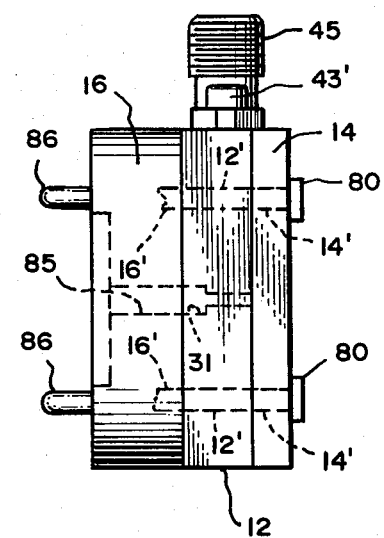
FIG. 1 is a side view of a frequency multiplier embodying my invention.
Figure 2:
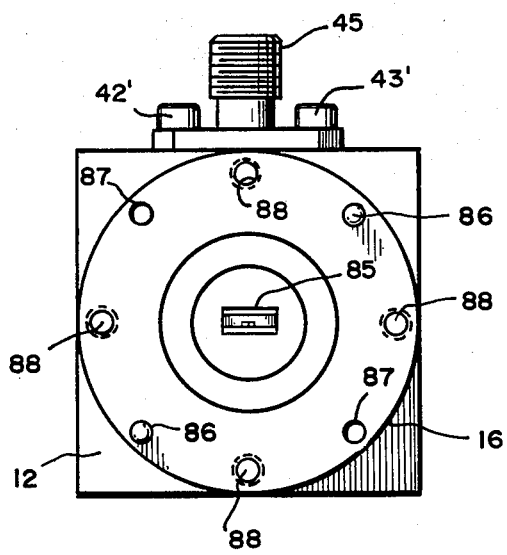
FIG. 2 is a front view of the multiplier shown in FIG. 1.

Referring to FIGS. 1 and 2, the reference numeral 10 generally designates a frequency multiplier comprising an RF block 12, a backplate 14, and a flange member 16.

Figure 3:
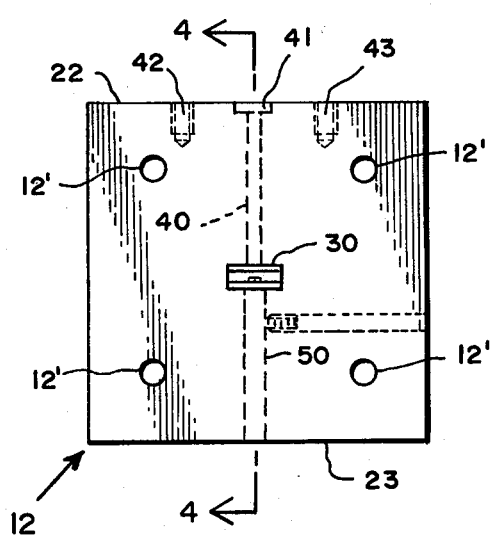
FIG. 3 is a front or plan view of the RF block used in the multiplier.
Figure 4:
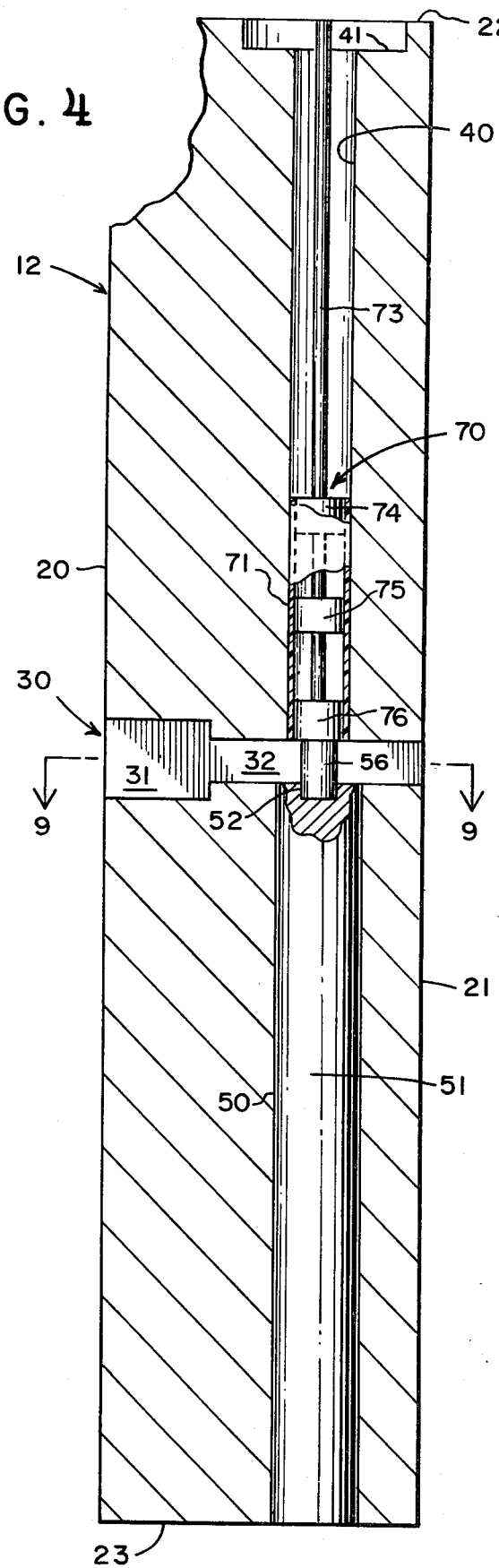
FIG. 4 is a cross-sectional view of the RF block as viewed along section line 4—4 of FIG. 3.

The RF block 12 is shown in greater detail in FIGS. 3 and 4. It comprises a square-shaped member having a pair of main or end surfaces 20 and 21 parallel to one another, a top surface 22 and a bottom surface 23. As depicted, all of said surfaces are either parallel to one another or perpendicular to one another as is evident from the drawing. A plurality of assembly holes or apertures 12' are provided (see FIG. 3) for facilitating the assembly of the multiplier. An RF output port 30 is provided in the center of main surface 20, port 30 having a rectangular cross-section of constant widths (see FIG. 3) and with a first portion 31 thereof (see FIG. 4) adjacent to said main surface 20 having a height selected in accordance with the desired frequency output of the multiplier and with the remainder of the port 32 having a height substantially reduced from that of portion 31. More specifically, port portions 31 and 32 comprise a one-quarter wave-length transformer to provide an impedance match between diodes 64 and 64' (to be described below) and a standard wave-guide (not shown) adapted to be connected to flange 16.

An RF input port 40 having preferably a round cross-section extends from the center of the top surface 22 (as viewed in FIG. 3) vertically downwardly through the block 12 to intersect with portion 32 of the RF output port 30. Thus, the axis of RF input port 40 is perpendicular to the axis of the RF output port 30. A recess 41 at the top of port 40 and a pair of threaded recesses 42 and 43 on opposite sides of 40 in the top surface 22 of block 12 are adapted to provide a means of coaction with a standard RF input fitting 45, a pair of machine screws 42' and 43' being used to attach the fitting 45 to the block 12.

Figure 10:
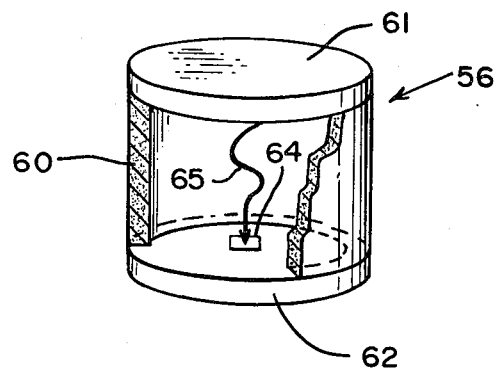
FIG. 10 is an enlarged view of the capsule for housing the diodes.
Figure 9:
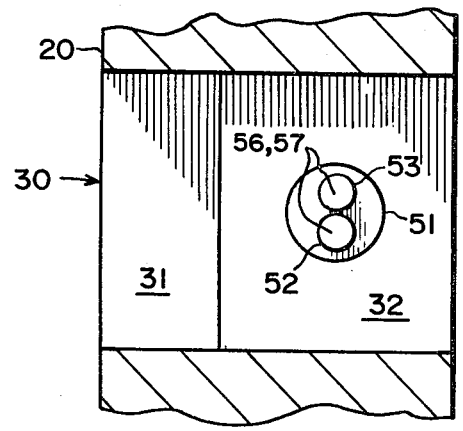
FIG. 9 is an end view of the diode post of FIG. 7.
Figure 8:
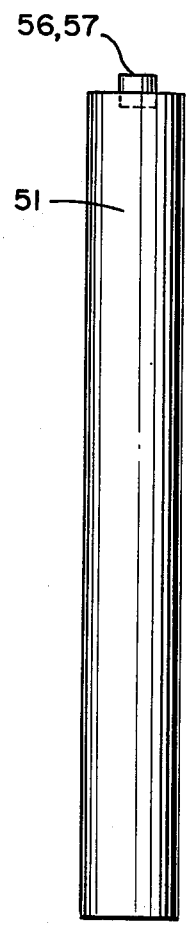
FIG. 8 is a side view of a diode post used in the multiplier.

A diode post aperture 50 is provided in the block 12 and extends from the middle of the bottom surface 23 (as viewed in FIG. 3) vertically upwardly to intersect at the bottom of the remainder 32 of the RF output port 30. Aperture 50 is preferably of circular cross-section and is adapted to receive a metallic (preferably brass) diode post 51 shown in greater detail in FIGS. 8 and 9. At one end of the diode post 51 are a pair of circular recesses 52 and 53 (see FIG. 9) into which are set a pair of diode capsules or housings 56 and 57 shown in FIG. 11. In FIG. 10 capsule or housing 56 is shown in more detail, the housing 56 comprising an annular ring 60 preferably made of ceramic material capped at both ends by a pair of metal plates 61 and 62 (preferably brass having gold plated surfaces) the end plates 61 and 62 being bonded to the two axial ends of the ceramic ring 60. A diode 64 is bonded to the inside face of plate 62 at about the center thereof and an electrically conductive whisker element 65 attached at one end to the diode 64 extends upwardly to and is electrically connected to the underside of metallic plate 61. Diode 64 is of the nonlinear resistance type, in my preferred embodiment I use GaAs Schottky-barrier diodes. Diodes that have been found satisfactory for my invention are Texas Instrument Company-type MDX 654. Thus, there is electrical continuity from brass plate 61 through whisker 65, diode 64, the other plate 62, to the brass post 51 and thence to the housing 12 (post 51 being in electrical contact with housing 12 when positioned in diode post aperture 50).

Figure 11:
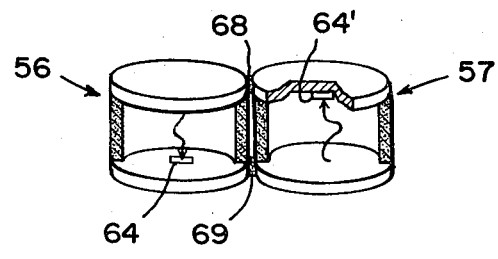
FIG. 11 is a showing of the two diode capsules or housings positioned in side by side relationship.

Referring to FIG. 11 where the housings 56 and 57 are shown in side by side relationship, it will be noted that for housing 56 the diode 64 is on the lower metallic end piece, i.e., member 62. On the other hand, the housing 57 contains the reverse arrangement, i.e., the diode 64' mounted to the underside of the top (as shown in FIG. 11) metallic end piece on the housing 57. The housings 56 and 57 are placed in side by side relationship and then the metallic end pieces thereof are fixed with respect to each other, e.g., soldered at the point of contact as at 68 and 69. The diameter of the metallic end pieces 61 and 62 are such so as to permit the housings 56 and 57 to be set into the circularly-shaped recesses 52 and 53 shown in FIG. 9. The diode post 51 is inserted into the RF block 12 and pushed up into the aperture 50 to the point where the diodes 64 and 64' are mounted so as to lie in side by side relationship transverse to the RF output port 30, see FIGS. 3 and 4.

Typical dimensions of the diode housings 56 and 57 would be for the brass gold plated plates 61 and 62 to be approximately 0.01 inch thick with a diameter of 0.02 inch. The annular ceramic ring would also have an outside diameter of 0.02 inch, an inside diameter of 0.01 inch and an axial length of 0.02 inch.

Further, in the preferred embodiment, the diode post would have a diameter of approximately 0.063 inch, a length of approximately 0.545 inch and the counter sunk recesses 52 and 53 would be approximately 0.010 inch deep and also would be spaced from the outside or cylindrical surface of the post 51 by a dimension of approximately 0.005 inch.

Figure 6:
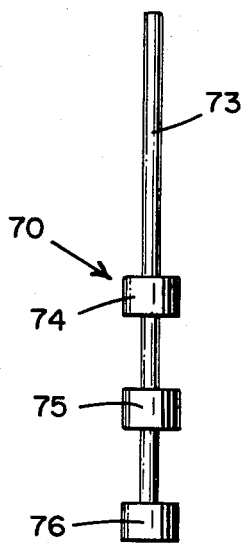
FIG. 6 is a view of a low-pass filter used in the multiplier.
Figure 7:
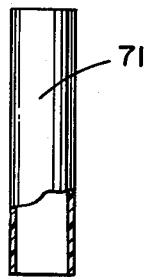
FIG. 7 is a view of an insulative sleeve used to insulate the low-pass filter from the RF block.

FIG. 6 depicts a low pass filter unit which is adapted to be insulatively positioned in the RF input aperture or port 40. To this end is provided an insulative sleeve 71 shown in FIG. 7 having an outer diameter slightly smaller than the diameter of the port 40. In the preferred embodiment input port 40 has a diameter of 0.045 inch and sleeve 71 has an outer diameter of 0.044 inch. Also in the preferred embodiment I use Teflon material for the insulative sleeve 71, the sleeve having an axial length of 0.177 inch and an inside diameter of approximately 0.0375 inch. The low pass filter 70 comprises an elongated rod element 73 of relatively small diameter, e.g., 0.009 inch together with three spaced apart shoulder portions 74, 75 and 76 of larger diameter, e.g., 0.037 inch. The maximum diameter of the elements 74, 75, and 76 is slightly less than the inside diameter of the bore of the sleeve 71, e.g., 0.037 inch.

One end of the elongated rod element 73 is adapted to be attached by means such as soldering to the underside of the fitting 45 and low pass filter 70 and sleeve 71 are inserted into the bore 40 to the position depicted in FIG. 4 wherein the underside of shoulder portion 76 is substantially coplanar with the top surface of portion 32 of the RF output port 30. The underside of shoulder 76 is also in physical abutment with the top surfaces, i.e., cover plates 61, of diode capsules 56 and 57. Means such as a set screw may be used for holding rod 51 fixed with respect to block 12.

Figure 5:
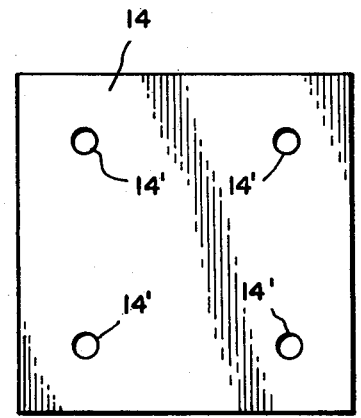
FIG. 5 is a view of a back plate for the multiplier.

Backplate 14 is shown in greater detail in FIG. 5 and comprises a square piece of flat metallic (preferably brass) material having the same plan dimensions as that of the RF block. A plurality of holes 14' are drilled through backplate 14 and are of the same size and have the same general spacing from one another as the holes 12' in the RF block 12 previously discussed.

Referring again to FIG. 1, i.e., the assembly of the multiplier, it will be noted that a plurality of machine screws 80 are inserted through the holes 14' in backplate 14 and 12' in the RF block 12 and are threaded into threaded recesses 16' in the flange member 16, the machine screws 80 being tightened to the point where members 12, 14 and 16 are held in tight abutting relationship. The flange 16 is metallic (preferably brass), of standard configuration and comprises in part a centrally located RF output opening 85 (see FIGS. 1 and 2) which extends therethrough and is adapted to be the same size as, and in register with, the RF opening 30 in the RF block 12. The flange member 16 also has standard attachment means including a pair of pin members 86, a pair of recesses 87, and four threaded mounted recesses 88.

Figure 12:
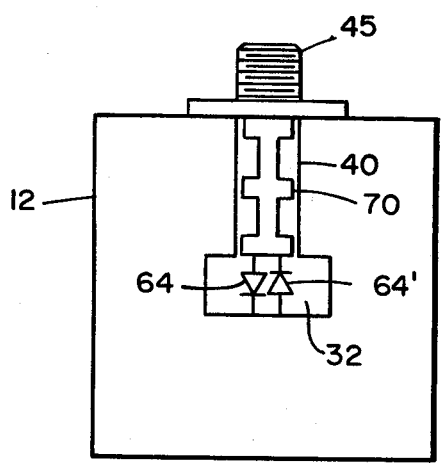
FIG. 12 is a somewhat schematic view showing the RF apertures, low-pass filter, and rectifying diodes.

Referring to FIG. 12, the schematic representation of a portion of the multiplier, it will be noted that the RF block 12 has been depicted together with the RF input port 40 and its associated input fitting 45 with the input port terminating at its bottom extremity intersecting with the so-called remaining portion 32 of the RF output port 30. Further the diodes 64 and 65 are shown in anti-parallel relationship and in side by side relationship in and transverse to the port 32. They are shown electrically connected between the bottom of the low pass filter 70 and the RF block 12.

The pair of anti-parallel diodes 64 and 64' function as nonlinear elements with respect to both the signal input and output ports 40 and 30 respectively. Mathematical analysis can demonstrate that there is an anti-symmetry of the current and voltage characteristics and the result is that only odd-harmonics of the input signal frequency are processed by the multiplier. In addition to this, there is no DC current flowing through the diode pair. Therefore there will be no DC dissipation loss and even-harmonics of the fundamental will be inherently terminated without using extra filters or balanced circuits. Because of this, my invention provides the advantage of lower conversion loss.

While I have described a preferred embodiment of the invention, it will be understood that the invention is limited only by the scope of the following claims:

I claim:

1. A millimeter-wave odd-harmonic frequency multiplier comprising:

(a) a block member of metallic material, said member having a main surface and a top surface at an angle to said main surface, (b) a wave-guide RF output port extending from said main surface part way through said member, said port having a rectangular cross-section of constant width and with a first portion of said port adjacent to said main surfaces having a height selected in accordance with the desired frequency output of said multiplier and the remainder of said port having a height substantially reduced from that of said first portion, (c) an RF input port extending from said top surface through said block member to connect with said remainder of said wave-guide port, (d) low pass filter means insulatively positioned in said input port, and (e) a pair of anti-parallel diodes positioned at the junction of said remainder of said wave-guide output port and said RF input port, whereby said multiplier functions, upon a millimeter-wave signal of a base frequency being applied to said RF input port, to produce an output signal at said RF output port of an odd-harmonic of said base frequency.

2. Apparatus of claim 1 further characterized by said (i) main and top surfaces and (ii) the axes of said output and input ports being respectively perpendicular to one another.

3. Apparatus of claim 2 further characterized by a metallic flange member being attached to said block member at said main surface thereof and having an RF output port positioned in register with said RF wave-guide output port of said block member.

4. Apparatus of claim 1 further characterized by said diodes being of the nonlinear resistance type.

5. Apparatus of claim 4 further characterized by said diodes being of the Schottky-barrier type.

6. A millimeter-wave frequency tripler comprising:
(a) a block member of metallic material, said member having a main surface and a top surface at an angle to said main surface, (b) a wave-guide RF output port extending from said main surface part way through said member, said port having a rectangular cross-section of constant width and with a first portion of said port adjacent to said main surfaces having a height selected in accordance with the desired frequency output of said multiplier and the remainder of said port having a height substantially reduced from that of said first portion, (c) an RF input port extending from said top surface through said block member to connect with said remainder of said wave-guide output port, (d) low pass filter means insulatively positioned in said input port, (e) a pair of anti-parallel diodes positioned at the junction of said remainder of said wave-guide output port and said RF input port, and (f) a metallic flange member attached to said block member at said main surface thereof and having a RF output port positioned in register with said wave-guide output port of said block member, whereby said multiplier functions, upon a millimeter-wave signal of a frequency of X being applied to said RF input port, to produce an output signal of a frequency of 3X at said RF output port of said flange member.

7. Apparatus of claim 6 further characterized by said (i) main and top surfaces and (ii) the axes of said output and input ports being respectively perpendicular to one another.

8. Apparatus of claim 6 further characterized by said diodes being of the nonlinear resistance type.

9. Apparatus of claim 8 further characterized by said diodes being of the Schottky-barrier type.

10. Apparatus of claim 9 further characterized by said multiplier including an RF input coupling means attached to said block member at the top surface thereof.

11. Apparatus of claim 6 further characterized by said diodes being mounted on the end of a member positioned in an aperture of said block member.

12. Apparatus of claim 8 further characterized by said diodes being oriented so as to lie in side by side transverse relationship in and to said RF output port.

* * * * *